United States Patent
Jiang et al.

(10) Patent No.: US 10,609,491 B1
(45) Date of Patent: Mar. 31, 2020

(54) SPEAKER AND MEMS ACTUATOR THEREOF

(71) Applicant: MERRY ELECTRONICS (SHENZHEN) CO., LTD., Guangdong (CN)

(72) Inventors: Kai-Yu Jiang, Taichung (TW); Jen-Yi Chen, Taichung (TW); Vel Sankar Ramachandran, Taichung (TW)

(73) Assignee: MERRY ELECTRONICS (SHENZHEN) CO., LTD., Guangdong (CN)

( * ) Notice: Subject to any disclaimer, the term of this patent is extended or adjusted under 35 U.S.C. 154(b) by 0 days.

(21) Appl. No.: 16/297,725

(22) Filed: Mar. 11, 2019

(30) Foreign Application Priority Data

Sep. 14, 2018 (CN) ................................. 107132515

(51) Int. Cl.
| | | |
|---|---|---|
| *H04R 17/00* | (2006.01) | |
| *H01L 41/09* | (2006.01) | |
| *H01L 41/18* | (2006.01) | |
| *H04R 7/16* | (2006.01) | |
| *B81B 3/00* | (2006.01) | |

(52) U.S. Cl.
CPC ........... *H04R 17/00* (2013.01); *B81B 3/0021* (2013.01); *H01L 41/094* (2013.01); *H01L 41/18* (2013.01); *H04R 7/16* (2013.01); *B81B 2203/0127* (2013.01); *H04R 2201/003* (2013.01)

(58) Field of Classification Search
CPC .... H04R 17/00; H04R 7/16; H04R 2201/003; B81B 3/0021; B81B 2203/0127; H01L 41/094; H01L 41/18
See application file for complete search history.

(56) References Cited

U.S. PATENT DOCUMENTS

| 5,049,775 A * | 9/1991 | Smits ................... H01L 41/0946 310/328 |
|---|---|---|
| 5,633,552 A * | 5/1997 | Lee ....................... A61B 18/1402 310/311 |
| 5,956,292 A * | 9/1999 | Bernstein ................ H04R 17/00 29/25.35 |
| 6,857,501 B1 * | 2/2005 | Han ......................... H04R 17/00 181/158 |
| 7,104,134 B2 * | 9/2006 | Amano ...................... G01L 1/16 73/702 |
| 8,958,595 B2 * | 2/2015 | Hwang ................... H04R 17/00 381/190 |
| 9,516,421 B1 * | 12/2016 | Loeppert ................. H04R 17/02 |
| 10,167,189 B2 * | 1/2019 | Zhang .................... B81B 7/0048 |
| 10,284,960 B2 * | 5/2019 | Grosh ....................... H04R 7/06 |
| 2005/0130360 A1 * | 6/2005 | Zhan ...................... B81B 3/0021 438/197 |
| 2010/0219722 A1 * | 9/2010 | Onishi ................... B06B 1/0651 310/348 |
| 2017/0021391 A1 * | 1/2017 | Guedes ................. B06B 1/0603 |

\* cited by examiner

*Primary Examiner* — Oyesola C Ojo
(74) *Attorney, Agent, or Firm* — CKC & Partners Co., LLC

(57) ABSTRACT

A speaker includes a diaphragm and a MEMS actuator. The MEMS actuator includes a coupling member attached to the diaphragm and at least one closed cantilever ring that is surrounded around and connected to the coupling member by plural first bridge members, wherein the closed cantilever ring is configured to be electrically-biased to cause an axial movement of the coupling member and the diaphragm.

15 Claims, 7 Drawing Sheets

SPEAKER AND MEMS ACTUATOR THEREOF

CROSS-REFERENCE TO RELATED APPLICATION

This application claims priority to Taiwan Application Serial Number 107132515, filed Sep. 14, 2018 which is herein incorporated by reference.

BACKGROUND

Field of Invention

The present disclosure relates to a speaker, and more particularly, to a speaker equipped with a microelectromechanical system (MEMS) actuator.

Description of Related Art

Listening to music has become an indispensable part of modern life to regulate tension and monotony. Therefore, the sound quality of music produced by the speakers (such as speakers, headphones, etc.) of general consumer products and the experience of using the speaker to listening to music will affect consumption. As consumer demands for sound quality are also higher and higher, the requirements for speakers of general consumer products are increasingly taken care so as to improve the sound quality and the consumer experience.

Speakers include a variety of different sizes to satisfy with actual demands. The wireless in-ear earphone allows the user to wear headphones to enjoy music in more situations, such as during exercises. Wireless in-ear headphones not only need to be small in their sizes, but also need to consume low power to meet the needs of long-term continuous use. How to output high sound quality in a small, low-power speaker is one of the product trends developed by speaker manufacturers.

SUMMARY

In one or more embodiments, a speaker includes a diaphragm and a MEMS actuator. The MEMS actuator includes a coupling member attached to the diaphragm and at least one closed cantilever ring that is surrounded around and connected to the coupling member by plural first bridge members, wherein the closed cantilever ring is configured to be electrically-biased to cause an axial movement of the coupling member and the diaphragm.

In one or more embodiments, a MEMS actuator is a flat-sheet component including a coupling member and a first closed cantilever ring that is surrounded around and connected to the coupling member by plural first bridge members, wherein the first closed cantilever ring has plural discontinuous first piezoelectric material sections, the plural discontinuous first piezoelectric material sections are configured to be electrically-biased to bend towards a normal direction of the flat-sheet component.

In one or more embodiments, the first closed cantilever ring is a circular closed cantilever ring.

In one or more embodiments, the flat-sheet component further includes plural outer bridge members to be connected to an outer support member.

In one or more embodiments, the outer support member includes an electrode member that is electrically connected to the plural discontinuous first piezoelectric material sections via the plural outer bridge members.

In one or more embodiments, the first closed cantilever ring has plural discontinuous second piezoelectric material sections that are electrically connected to the plural discontinuous first piezoelectric material sections.

In one or more embodiments, the flat-sheet component further includes plural second bridge members to be connected to a second closed cantilever ring.

In one or more embodiments, the second closed cantilever ring has plural discontinuous second piezoelectric material sections that are radially misaligned with the plural discontinuous first piezoelectric material sections of the first closed cantilever ring.

In one or more embodiments, the plural discontinuous second piezoelectric material sections of the second closed cantilever ring and the plural discontinuous first piezoelectric material sections of the first closed cantilever ring are electrically connected to each other and made from different materials.

In one or more embodiments, the plural discontinuous second piezoelectric material sections of the second closed cantilever ring and the plural discontinuous first piezoelectric material sections of the first closed cantilever ring are electrically connected to each other and applied with electrical biases of different polarities.

In one or more embodiments, the second closed cantilever ring has plural discontinuous second piezoelectric material sections, each first piezoelectric material section and each second piezoelectric material section, which are immediately-adjacent to a corresponding one of the second bridge members, are configured to be electrically-biased to bend towards opposite directions.

In one or more embodiments, the second closed cantilever ring has plural discontinuous second piezoelectric material sections, each first piezoelectric material section and each second piezoelectric material section, which are immediately-adjacent to a corresponding one of the second bridge members, are configured to be electrically-biased to bend towards opposite directions in the normal direction of the flat-sheet component.

In one or more embodiments, a first group of the first piezoelectric material sections immediately-adjacent to the first bridge members and a second group of the first piezoelectric material sections immediately-adjacent to the second bridge members are configured to be electrically-biased to bend towards opposite directions.

In one or more embodiments, the first bridge members and the second bridge members are radially misaligned with each other.

In one or more embodiments, the first bridge members are spaced from each other with a uniform gap, or the second bridge members are spaced from each other with a uniform gap.

In sum, the speaker and MEMS actuator disclosed herein utilizes its piezoelectric material section and closed cantilever rings arranged around the coupling member so as to generate a stable and greater axial deformation to move the diaphragm, thereby outputting high quality sounds.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
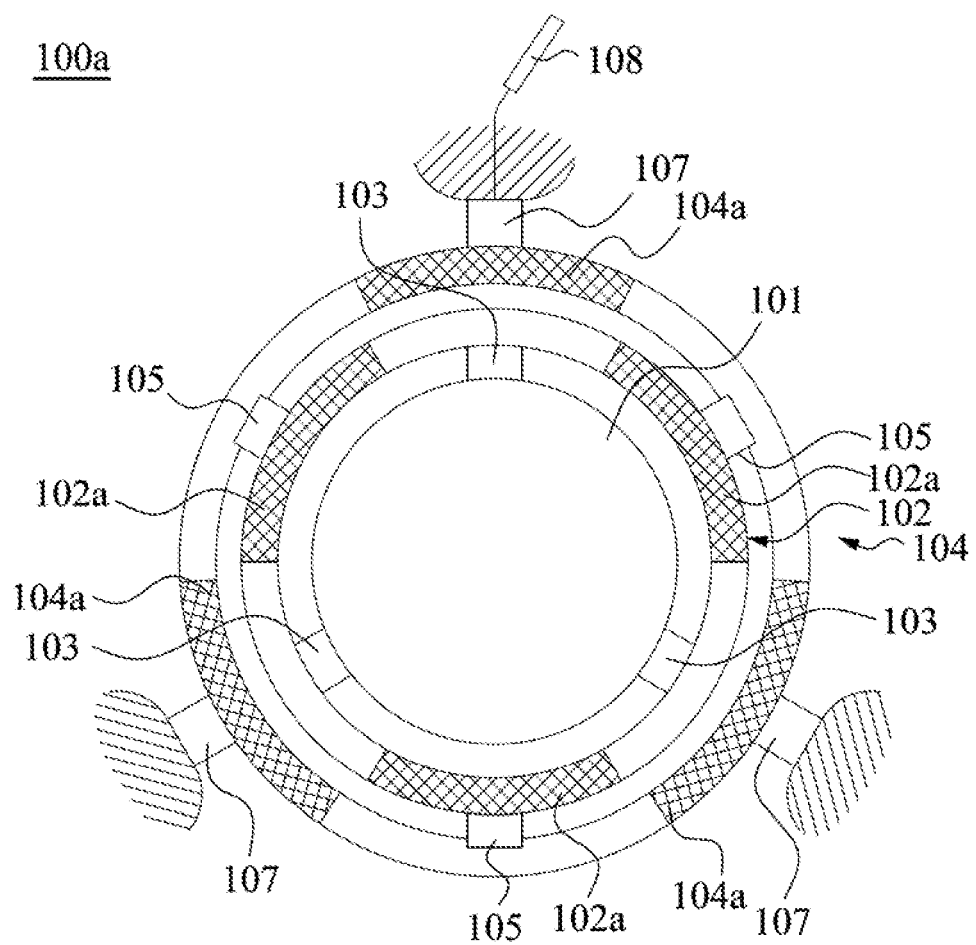
FIG. 1 illustrates a top view of a MEMS actuator according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1 which illustrates a top view of a MEMS actuator 100a according to one embodiment of the present disclosure. The MEMS actuator 100a is a flat-sheet component including a coupling member 101, a closed cantilever ring 102 and a closed cantilever ring 104 etc. The closed cantilever ring 102 is surrounded around the coupling member 101 and connected to the coupling member 103 by plural bridge members 103. The closed cantilever ring 104 is surrounded around and connected to the closed cantilever ring 102 by plural bridge members 105. The bridge members 107 may serve as outer bridge members for the closed cantilever ring 104 to be connected to an outer support member. The microelectromechanical system (MEMS) actuator is an actuator using modified semiconductor device fabrication technologies to integrate electronics and mechanical parts so as to reduce its power consumption and size.

In this embodiment, the closed cantilever ring 102 and the closed cantilever ring 104 may be circular closed cantilever rings, but not being limited thereto. For example, the closed cantilever ring may be oval or polygonal closed cantilever ring.

In this embodiment, the plural bridge members 103 and bridge members 105 may be radially misaligned with each other to cause the MEMS actuator 100a to have a more stable vibration with a larger axial deformation distance, and corresponding pairs of the plural bridge members 103 and bridge members 107 may be radially aligned with each other according to actual demands.

In this embodiment, the closed cantilever ring 102 and/or the closed cantilever ring 104 may have a uniform width, but not being limited thereto.

The closed cantilever ring 102 has plural discontinuous piezoelectric material sections 102a. The plural discontinuous piezoelectric material sections 102a are configured to be electrically-biased to bend towards a normal direction of the flat-sheet component. In this embodiment, each piezoelectric material section 102a extend towards two opposite directions from a corresponding bridge member 105 in the closed cantilever ring 102, but not being limited thereto.

The closed cantilever ring 104 may have plural discontinuous piezoelectric material sections 104a, and those piezoelectric material sections (102a, 104a) may be radially misaligned with each other. Those piezoelectric material sections 104a are configured to be electrically-biased to bend towards a normal direction of the flat-sheet MEMS actuator 100a. When those piezoelectric material sections (102a, 104a) are both configured to be electrically-biased to bend towards a normal direction of the MEMS actuator 100a, such that a maximum deformation along the normal direction of the MEMS actuator 100a will be prolonged. In this embodiment, each piezoelectric material section 104a extends towards two opposite directions from a corresponding bridge member 107 in the closed cantilever ring 104, but not being limited thereto.

An outer support member of the MEMS actuator 100a may further include an electrode member 108 that is electrically connected to the plural discontinuous piezoelectric material sections via the plural outer bridge members, e.g., 103, 105 and 107 so as to supply power while operating the MEMS actuator.

Figure 2:
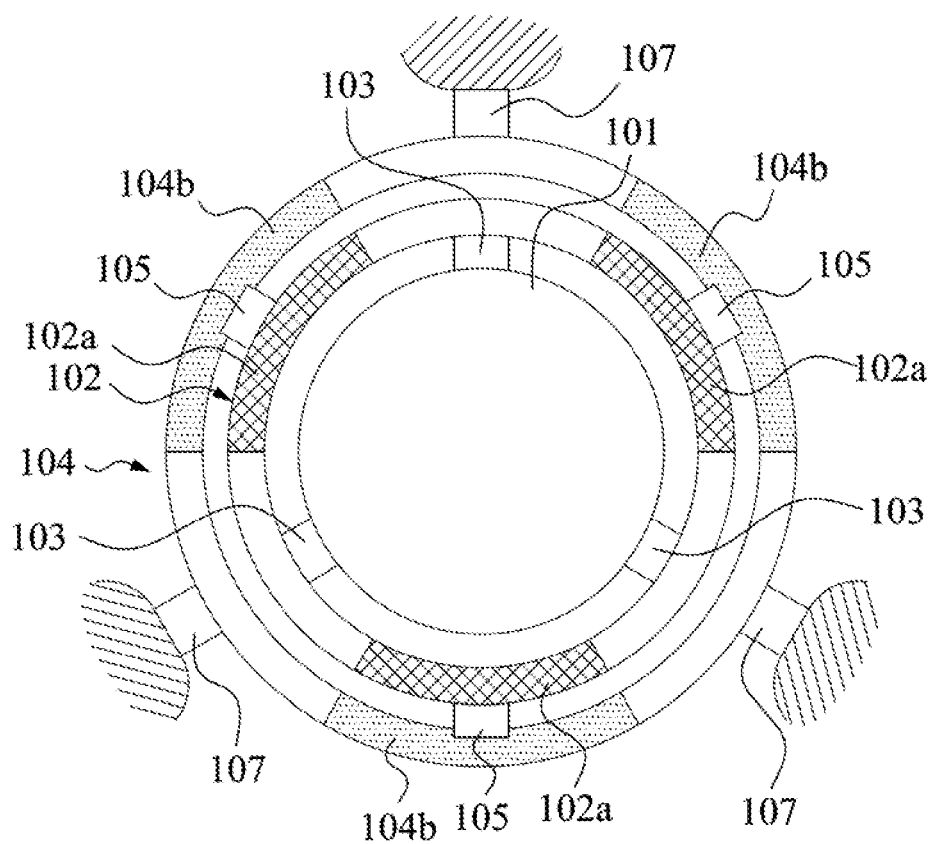
FIG. 2 illustrates a top view of a MEMS actuator according to another embodiment of the present disclosure.

Reference is made to FIG. 2, which illustrates a top view of a MEMS actuator according to another embodiment of the present disclosure. The M EMS actuator 100b is a flat-sheet component, which is different from the MEMS actuator 100a in the arrangement of piezoelectric material sections in the closed cantilever ring 104.

Figure 4:
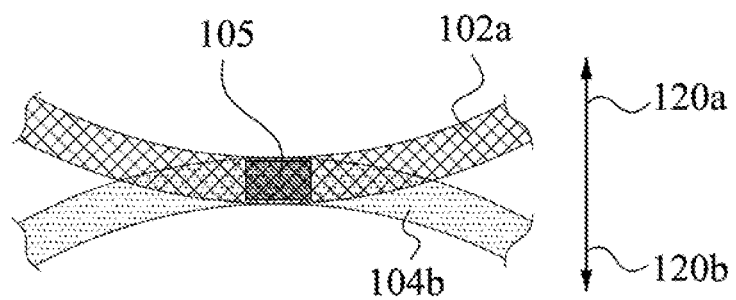
FIG. 4 illustrates a side view of the MEMS actuator of FIG. 2 or FIG. 3 in operation.

Reference is made to FIGS. 2 and 4, and FIG. 4 illustrates a side view of the MEMS actuator of FIG. 2 in operation. The closed cantilever ring 104 has plural discontinuous piezoelectric material sections 104b, and each pair of piezoelectric material sections (102a, 104b), which are immediately-adjacent to a corresponding one of the second bridge members 105, are configured to be electrically-biased to bend towards opposite directions. For example, each piezoelectric material section 102a has its two opposite ends bent towards a direction 120a relative to the bridge member 105 to form an arc-shaped member, and the piezoelectric material section 104b has its two opposite ends bent towards a direction 120b relative to the bridge member 105 to form another arc-shaped member. The directions (120a, 120b) are two opposite directions along the normal direction 120 of the flat-sheet actuator (referring also to FIG. 8). In this embodiment, each piezoelectric material section 104b extends towards two opposite directions from a corresponding bridge member 105 in the closed cantilever ring 104, but not being limited thereto.

Figure 3:
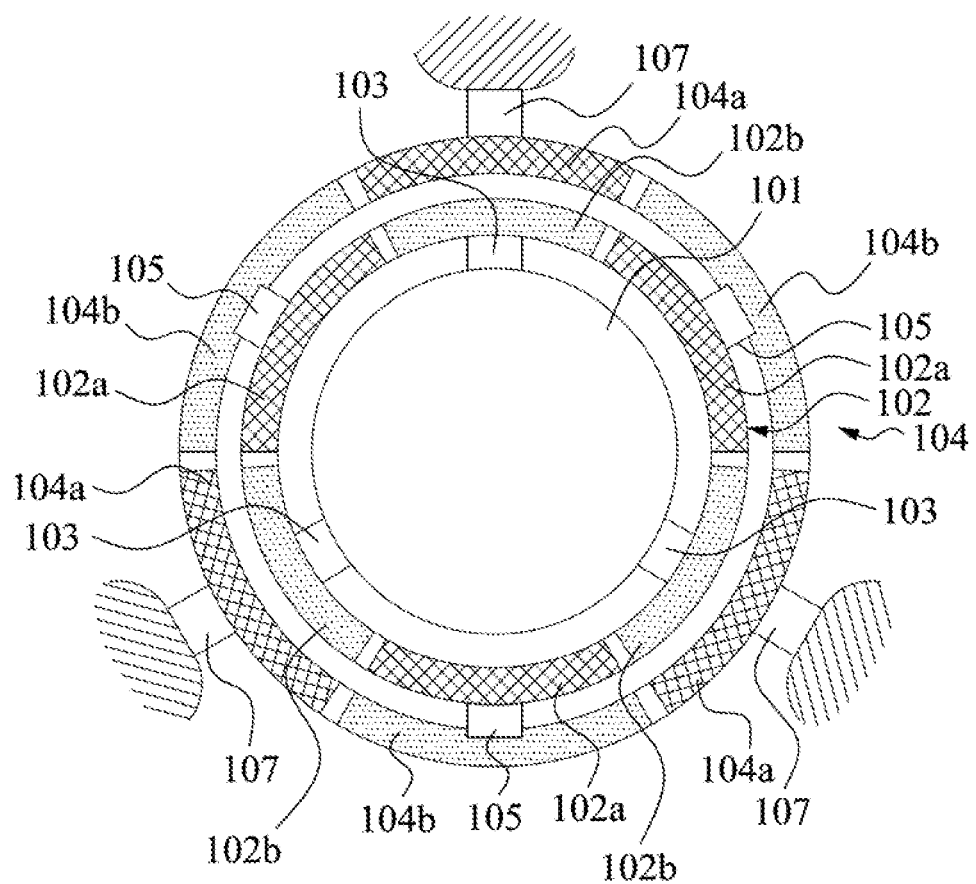
FIG. 3 illustrates a top view of a MEMS actuator according to another embodiment of the present disclosure.

Reference is made to FIG. 3, which illustrating a top view of a MEMS actuator according to another embodiment of the present disclosure. The MEMS actuator 100c is a flat-sheet component, which is different from the MEMS actuator 100b in the arrangement of piezoelectric material sections in the closed cantilever rings (102, 104).

Figure 5:
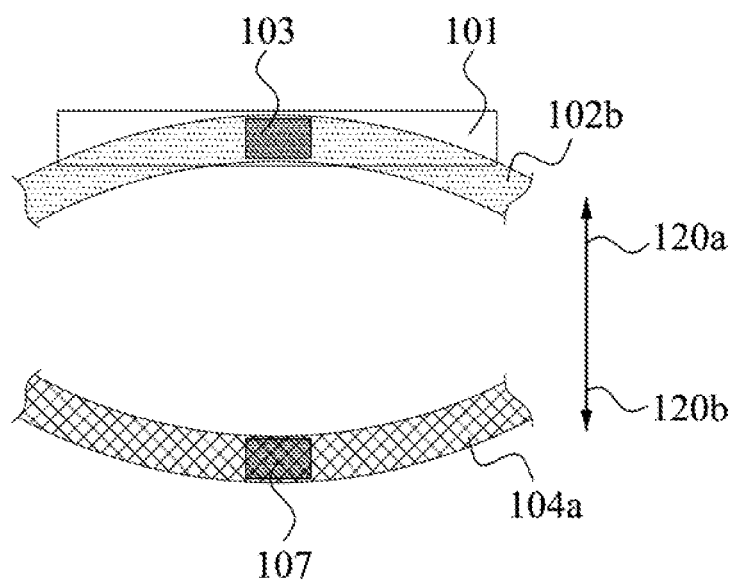
FIG. 5 illustrates a side view of the MEMS actuator of FIG. 3 in operation.

Reference is made to FIGS. 3-5. FIGS. 4, 5 both illustrate side views of the MEMS actuator of FIG. 3 in operation. The MEMS actuator 100c is different from the MEMS actuator 100b in that the closed cantilever ring 102 further includes plural discontinuous piezoelectric material sections 102b, and the closed cantilever ring 104 further includes plural discontinuous piezoelectric material sections 104a. In this embodiment, those piezoelectric material sections 102a are electrically connected with those piezoelectric material sections 102b in the closed cantilever ring 102, and those piezoelectric material sections 104a are electrically connected with those piezoelectric material sections 104b in the closed cantilever ring 104, but not being limited thereto.

In this embodiment, each pair of piezoelectric material sections (102a, 104b), which are immediately-adjacent to a corresponding bridge member 105, are configured to be electrically-biased to bend towards opposite directions. For example, the piezoelectric material section 102a has its two opposite ends bent towards a direction 120a relative to the bridge member 105 to form an arc-shaped member while the piezoelectric material section 104b has its two opposite ends bent towards a direction 120b relative to the bridge member 105 to form another arc-shaped member. Each piezoelectric material section 102b immediately-adjacent to a corresponding bridge member 103 and each piezoelectric material section 102a immediately-adjacent to a corresponding bridge member 105 are configured to be electrically-biased to bend towards opposite directions. For example, the piezoelectric material section 102b has its two opposite ends bent towards a direction 120b relative to the bridge member 103 to form an arc-shaped member while the piezoelectric material section 102a has its two opposite ends bent towards a direction 120a relative to the bridge member 105 to form another arc-shaped member. Each piezoelectric material section 102b immediately-adjacent to a corresponding bridge member 103 and each piezoelectric material section 104a immediately-adjacent to a corresponding bridge member 107 are configured to be electrically-biased to bend towards opposite directions. For example, the piezoelectric material section 102b has its two opposite ends bent towards a direction 120b relative to the bridge member 103 to form an arc-shaped member while the piezoelectric material section 104a has its two opposite ends bent towards a direction 120a relative to bridge member 107 to form another arc-shaped member. The directions (120a, 120b) are two opposite directions along the normal direction 120 of the flat-sheet actuator (referring also to FIG. 8). The MEMS actuator 100c has such piezoelectric material section arrangement so as to generate a greater deformation than the MEMS actuator 100b along the normal direction 120. In this embodiment, each piezoelectric material section 102b extends towards two opposite directions from a corresponding bridge member 103 in the closed cantilever ring 102, but not being limited thereto.

Piezoelectric material sections electrically-biased to bend towards opposite directions may be realized by chosen different piezoelectric materials or applied with electrical biases of different polarities. For example, the piezoelectric material section 102a and the piezoelectric material section 104b may be made from different piezoelectric materials, and are bent towards opposite directions while being applied with electrical biases of the same polarity. Instead, the piezoelectric material section 102a and the piezoelectric material section 104b may be made from the same piezoelectric materials, and are bent towards opposite directions while being applied with electrical biases of different polarities. The piezoelectric material sections 102a and the piezoelectric material sections 104b may be electrically connected with other, but not being limited thereto.

Figure 6:
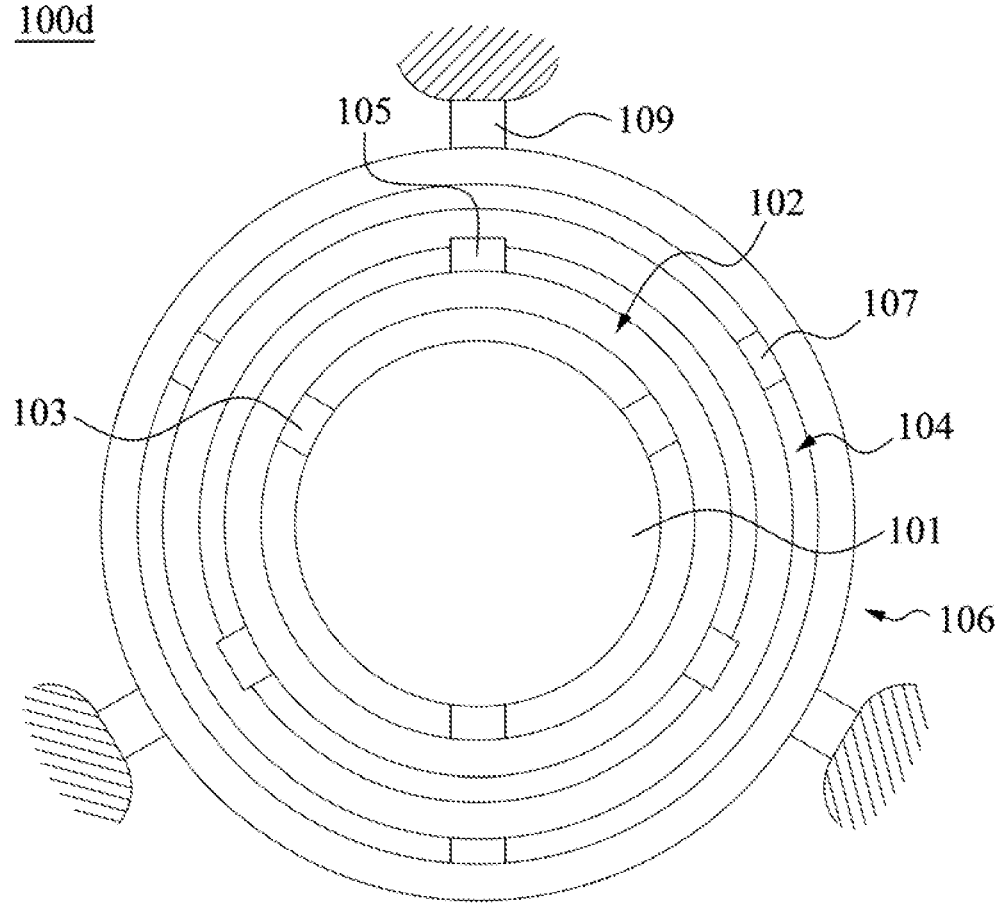
FIG. 6 illustrates a top view of a MEMS actuator according to still another embodiment of the present disclosure.

Reference is made to FIG. 6, which illustrates a top view of a MEMS actuator 100d according to still another embodiment of the present disclosure. The MEMS actuator 100d is a flat-sheet component, which is different from the previously-discussed MEMS actuators in the quantity of the closed cantilever ring.

The MEMS actuator 100d includes a coupling member 101, a closed cantilever ring 102, a closed cantilever ring 104 and a closed cantilever ring 106 etc. The closed cantilever ring 102 is surrounded around and connected to the coupling member 101 by the bridge members 103. The closed cantilever ring 104 is surrounded around and connected to the closed cantilever ring 102 by the bridge members 105. The closed cantilever ring 106 is surrounded around and connected to the closed cantilever ring 104 by the bridge members 107. The closed cantilever ring 106 is connected to an outer support member by outer bridge members 109. The closed cantilever rings 102, 104 and 106 are spaced from each other by a uniform gap.

In the above-discussed embodiments, those bridge members 103 are radially misaligned with those bridge members 105 while corresponding pairs of those bridge members (103, 107) are radially aligned with each other, but not being limited thereto. Those bridge members 105 are radially misaligned with those bridge members 107 while corresponding pairs of those bridge members (105, 109) are radially aligned with each other, but not being limited thereto.

In the above-discussed embodiments, those bridge members 103 are spaced from each other by a uniform gap, those bridge members 105 are spaced from each other by a uniform gap, those bridge members 107 are spaced from each other by a uniform gap, and those bridge members 109 are spaced from each other by a uniform gap, but not being limited thereto.

Figure 7:
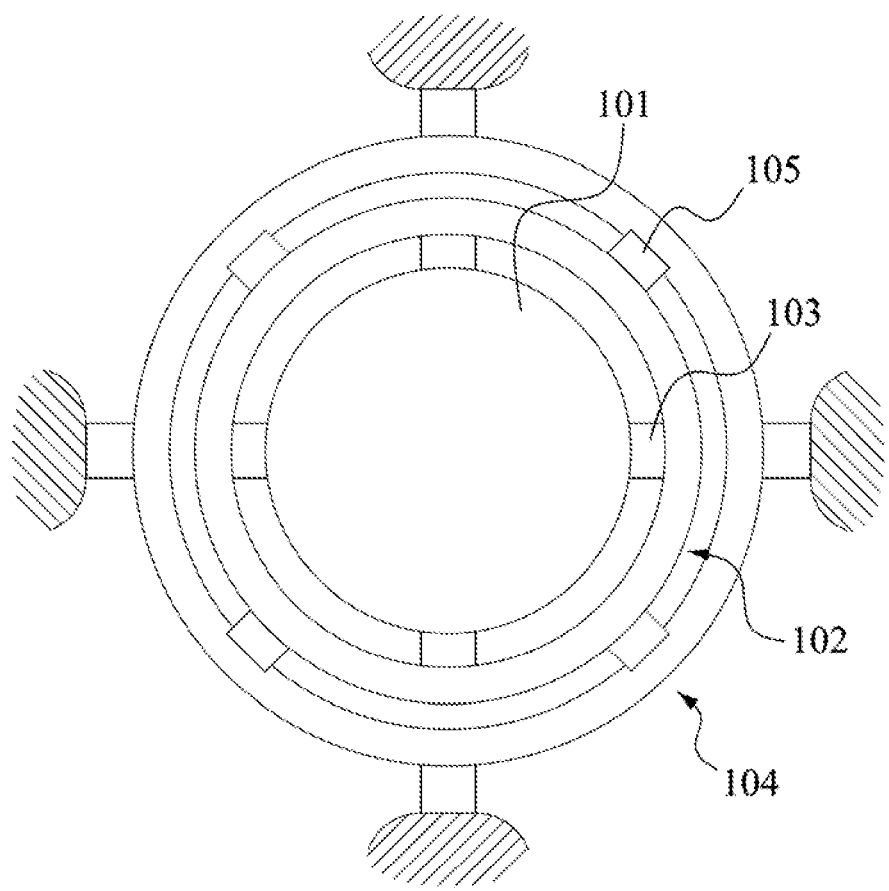
FIG. 7 illustrates a top view of a MEMS actuator according to still another embodiment of the present disclosure.

Reference is made to FIG. 7, which illustrates a top view of a MEMS actuator 100e according to still another embodiment of the present disclosure. The MEMS actuator 100e is a flat-sheet component, which is different from the previously-discussed MEMS actuators in the quantity of the bridge member.

The MEMS actuator 100e includes a coupling member 101, a closed cantilever ring 102 and a closed cantilever ring 104 etc. The closed cantilever ring 102 is surrounded around and connected to the coupling member 101 by four bridge members 103. The closed cantilever ring 104 is surrounded around and connected to the closed cantilever ring 102 by four bridge members 105. Compared with the previously-discussed MEMS actuators, the MEMS actuator 100e is equipped with more bridge members between adjacent closed cantilever rings. More bridge members are beneficial to the operation stability for an overall actuator architecture.

In the above-discussed embodiments, plural closed cantilever rings are surrounded around the coupling member as multiple concentric structures, e.g., those closed cantilever rings share a common center (i.e., a center of the coupling member), but not being limited thereto.

Figure 8:
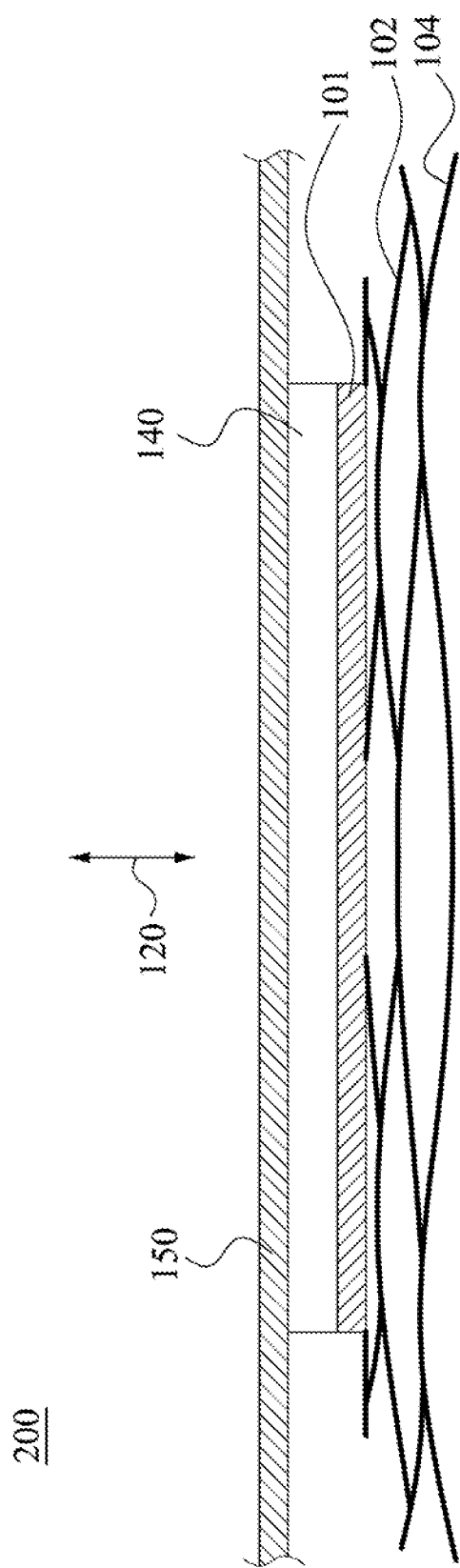
FIG. 8 illustrates a speaker equipped with MEMS actuator in operation according to an embodiment of the present disclosure.

Reference is made to FIG. 8 illustrates a speaker 200 equipped with MEMS actuator in operation according to an embodiment of the present disclosure. The speaker 200 includes a diaphragm 150 and a MEMS actuator, e.g., the MEMS actuator (100a, 100b, 100c, 100d or 100e). The coupling member 101 of the MEMS actuator may be connected to the diaphragm 150 directly or by an interface member 140. As discussed in previous embodiments, the closed cantilever rings (102, 104) are equipped with piezoelectric material sections, which are configured to be electrically-biased to generate an axial movement of the coupling member 101 and the diaphragm 150 along the normal direction 120 of the flat-sheet actuator.

In sum, the speaker and MEMS actuator disclosed herein utilizes its piezoelectric material section and closed cantilever rings arranged around the coupling member so as to generate a stable and greater axial deformation to move the diaphragm, thereby outputting high quality sounds.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A microelectromechanical system (MEMS) actuator comprising:
    a flat-sheet component comprising a coupling member and a first closed cantilever ring that is surrounded around and spaced from the coupling member, plural first bridge members are connected between the coupling member and the first closed cantilever ring, wherein the first closed cantilever ring has plural discontinuous first piezoelectric material sections, the plural discontinuous first piezoelectric material sections are configured to be electrically-biased to bend towards a normal direction of the flat-sheet component.

2. The MEMS actuator of claim 1, wherein the first closed cantilever ring is a circular closed cantilever ring.

3. The MEMS actuator of claim 1, wherein the flat-sheet component further comprises plural outer bridge members to be connected to an outer support member.

4. The MEMS actuator of claim 3, wherein the outer support member comprises an electrode member that is electrically connected to the plural discontinuous first piezoelectric material sections via the plural outer bridge members.

5. The MEMS actuator of claim 1, wherein the first closed cantilever ring has plural discontinuous second piezoelectric material sections that are electrically connected to the plural discontinuous first piezoelectric material sections.

6. The MEMS actuator of claim 1, wherein the flat-sheet component further comprises plural second bridge members to be connected to a second closed cantilever ring.

7. The MEMS actuator of claim 6, wherein the second closed cantilever ring has plural discontinuous second piezoelectric material sections that are radially misaligned with the plural discontinuous first piezoelectric material sections of the first closed cantilever ring.

8. The MEMS actuator of claim 7, wherein the plural discontinuous second piezoelectric material sections of the second closed cantilever ring and the plural discontinuous first piezoelectric material sections of the first closed cantilever ring are electrically connected to each other and made from different materials.

9. The MEMS actuator of claim 7, wherein the plural discontinuous second piezoelectric material sections of the second closed cantilever ring and the plural discontinuous first piezoelectric material sections of the first closed cantilever ring are electrically connected to each other and applied with electrical biases of different polarities.

10. The MEMS actuator of claim 6, wherein the second closed cantilever ring has plural discontinuous second piezoelectric material sections, each first piezoelectric material section and each second piezoelectric material section, which are immediately-adjacent to a corresponding one of the second bridge members, are configured to be electrically-biased to bend towards opposite directions.

11. The MEMS actuator of claim 10, wherein the second closed cantilever ring has plural discontinuous second piezoelectric material sections, each first piezoelectric material section and each second piezoelectric material section, which are immediately-adjacent to a corresponding one of the second bridge members, are configured to be electrically-biased to bend towards opposite directions in the normal direction of the flat-sheet component.

12. The MEMS actuator of claim 10, wherein a first group of the first piezoelectric material sections immediately-adjacent to the first bridge members and a second group of the first piezoelectric material sections immediately-adjacent to the second bridge members are configured to be electrically-biased to bend towards opposite directions.

13. The MEMS actuator of claim 6, wherein the first bridge members and the second bridge members are radially misaligned with each other.

14. The MEMS actuator of claim 6, wherein the first bridge members are spaced from each other with a uniform gap, or the second bridge members are spaced from each other by a uniform gap.

15. A speaker comprising:
    a diaphragm; and
    a MEMS actuator comprising a coupling member attached to the diaphragm and at least one dosed cantilever ring that is surrounded around and spaced from the coupling member, plural bridge members are connected between the coupling member and the closed cantilever ring, wherein the closed cantilever ring is configured to be electrically-biased to generate an axial movement of the coupling member and the diaphragm.

* * * * *